United States Patent [19]
Quan

[11] Patent Number: 5,229,735
[45] Date of Patent: Jul. 20, 1993

[54] WIDE FREQUENCY DEVIATION VOLTAGE CONTROLLED CRYSTAL OSCILLATOR HAVING PLURAL PARALLEL CRYSTALS

[75] Inventor: Ronald Quan, Cupertino, Calif.

[73] Assignee: Macrovision Corporation, Mountain View, Calif.

[21] Appl. No.: 860,643

[22] Filed: Mar. 30, 1992

[51] Int. Cl.$^5$ .................. H03B 5/36; H03H 9/00; H04N 9/455
[52] U.S. Cl. .................. 331/116 R; 358/19; 331/162; 331/177 V; 333/189
[58] Field of Search ............ 331/162, 116 R, 116 FE, 331/177 V; 358/19, 20; 333/187, 188, 189, 190, 191, 192

[56] References Cited

U.S. PATENT DOCUMENTS

| | | | |
|---|---|---|---|
| 3,170,120 | 2/1965 | Jensen et al. | 333/188 X |
| 3,358,244 | 12/1967 | Ho et al. | 331/162 X |
| 4,063,194 | 12/1977 | Helle | 331/116 R X |
| 4,994,764 | 2/1991 | Peters | 331/158 X |

FOREIGN PATENT DOCUMENTS

1045480 12/1958 Fed. Rep. of Germany ...... 331/162

OTHER PUBLICATIONS

*Science Manual—Video Tape Recorder*, IVC-900, International Video Corp., Feb. 1972, pp. 4–30.
*Handbook of Filter Synthesis*, A. I. Zverev, John Wiley & Sons, Inc., 1967, pp. 425, 426, 446, 452, 486–487.
"Survey of Crystal Oscillators", Roger Harrison, *Ham Radio*, Mar. 1976, pp. 10–22.

*Primary Examiner*—Siegfried H. Grimm
*Attorney, Agent, or Firm*—Skjerven, Morrill, MacPherson, Franklin & Friel

[57] ABSTRACT

A wide frequency deviation voltage controlled crystal oscillator includes a multiple section bandpass filter containing a plurality of crystal or ceramic elements. One embodiment includes a plurality of crystals which are connected into parallel conduction paths. The crystals have resonant frequencies which are separated by small, selected intervals so that the oscillator may be adjusted to a wider range of frequencies than prior art oscillators. Alternatively, the same result may be achieved by using crystals with the same resonant frequency and connecting each crystal to a capacitor having a selected value. In another embodiment a multiple section crystal or ceramic bandpass filter is substituted for the parallel conduction paths. The principles of the invention are applicable to a number of different devices, including the ringing circuits used in color televisions to perpetuate the color bursts which appear in the blanking intervals of the incoming TV signals.

57 Claims, 19 Drawing Sheets

WIDE FREQUENCY DEVIATION VOLTAGE CONTROLLED CRYSTAL OSCILLATOR HAVING PLURAL PARALLEL CRYSTALS

FIELD OF THE INVENTION

This invention relates to oscillating and ringing circuits and in particular to oscillating circuits in which the frequency of oscillation is determined by a resonating crystal or ringing circuit and by an input voltage applied to the circuit.

BACKGROUND OF THE INVENTION

Oscillating circuits which produce a variable frequency are well known. One type, inductor-capacitor (LC) oscillators, typically use a variable capacitor to achieve different frequencies, but LC oscillators do not provide consistent frequency output when they are exposed to temperature variations.

Crystal oscillators are far more resistent to temperature changes and have therefore found wide acceptance in the electronics and communications industries. A block diagram of a variable frequency crystal oscillator 10 is illustrated in FIG. 1, and a corresponding diagram of a particular circuit for oscillator 10 is illustrated in FIG. 2A. FIG. 1 shows a phase shift circuit 11 connected in a series loop with a resistor 12, a crystal 13 and an amplifier 14. Crystal 13 is cut to a particular frequency $f_r$ at which it will oscillate with a phase shift of 0°. When a phase shift is introduced into the circuit by phase shift circuit 11, crystal 13 is moved to an equal but opposite phase shift, and this alters the frequency at which the circuit oscillates.

FIG. 2A shows crystal 13 connected in series with resistor 12. The series combination of resistor 12-crystal 13 is driven by a driving transistor 25. Phase shift circuit 11 includes a "varactor" (voltage controlled variable capacitor) diode 20 along with an LC circuit including capacitors 21, 22 and 23 and an inductance 24. The component numbered 16 in FIG. 1 represents an attenuation factor "K" which is a function of capacitors 22 and 23 and transistor 25. Amplifier 14 is represented by a transistor 26. Current supplies 27 and 28 connect the emitters of transistors 25 and 26 to a negative supply voltage $V_{HH}$, and the collector of transistor 25 is connected to a positive supply voltage $V_{CC}$. The phase imposed by phase shift circuit Il is varied by adjusting $V_{20}$, which changes the capacitance of varactor diode 20. Diodes 29 limit the amplitude of the oscillations in the circuit. Varying the capacitance of varactor diode 20 changes the resonant frequency of the LC filter consisting of varactor diode 20, capacitors 21, 22 and 23 and inductance 24 and thereby changes the phase of the signal in oscillator 10.

The frequency of crystal 13 as a function of phase is illustrated in FIG. 3A, which shows that as the phase at which crystal 13 operates is shifted from 0° to $+\Delta 0$, the frequency is reduced to $f_r - \Delta f$, and if the phase is shifted to $-\Delta 0$, the frequency is increased to $f_r + \Delta f$. An important characteristic of the oscillator 10 is illustrated in FIG. 3B, which shows that the amplitude of the oscillations falls off quite rapidly as crystal 13 is pulled off its preferred frequency by phase shift circuit 11. The function of resistor 12, in fact, is to decrease the Q of crystal 13 and thereby allow a greater frequency shift from $f_r$. Nonetheless, as the frequency of crystal 13 is pulled downward, at some point the amplitude is reduced to the extent that oscillator 10 ceases to oscillate.

As the frequency is pulled upward, at some point oscillator 10 shifts abruptly to a "spurious frequency" $f_s$, at which it will remain fixed until the circuit is turned off. For example, at a resonant frequency $f_r$ of about 17 MHz, a prior art oscillator can be pulled upward only 1–2 KHz before it will jump to a spurious frequency 2–5 KHz above $f_r$.

Thus the operative range of oscillator 10 is bounded on the low end by the point at which it simply shuts down, and on the high end by the point at which it jumps to a spurious frequency. In prior art oscillators, this range has been somewhat limited. For example, the prior art voltage-controlled crystal oscillator (VXCO) shown in FIG. 2A, designed to operate at 15 MHz, might have a total deviation of ±1.5 KHz before one of these conditions occurs. This range can be approximately doubled by using crystals specially manufactured for use in VXCOs (i.e., to ±3 KHz at 15 MHz), but these crystals can be quite expensive.

The principles of this invention are also applicable to ringing circuits, such as those used in television equipment. As is well known, a television transmission signal normally contains a "color burst" in each horizontal blanking interval. The color burst is a signal at a reference frequency ($\approx$3.58 MHz in the NTSC standard) which is used in the television receiver's color demodulation circuits. Each color burst lasts approximately 8-10 cycles, and the color bursts are separated (blanked) by about 220 cycles of the reference frequency. FIG. 11A illustrates the color burst portion of a television signal.

A ringing circuit is used to provide a continuous reference frequency in the periods between the color bursts. Each color burst activates the ringing circuit and the latter continues to resonate at a gradually decreasing amplitude until it is activated by the next color burst. The decay which occurs between color bursts must be small enough that the ringing circuit continues to deliver a reference frequency of sufficient amplitude for the color demodulation circuits.

In normal television broadcasts, the reference frequency delivered in the color bursts is quite accurate. However, there can be problems when the signal is received from a video cassette recorder (VCR) or a laser video disk player, since the motors and/or tapes can lead to considerable variation in the reference color (chroma) frequency, particularly if the unit has no time base correction circuitry. VHS video cassette recorders which use the European PAL standard, in particular, exhibit considerable chroma time base instability. A PAL VHS video cassette recorder typically has a chroma phase "jitter" of 15°-25° or more, measured peak-to-peak (±1000 Hz). A standard crystal circuit or color burst ringing circuit has a range of only $\approx \pm 200$ Hz and therefore merely locks to average out the phase jitter of the color frequency off the tape rather than following the color phase and frequency faithfully. For proper color demodulation in a TV, or for clocking into a memory, the ringing circuit must track the incoming burst more accurately than this.

In the prior art, a wide deviation color frequency oscillator circuit normally includes a lower frequency (580 KHz) LC oscillator and a stable 3.0 MHz VXCO whose output signals are mixed. The upper sideband component from the mixer is selected by a bandpass filter to obtain the 3.58 MHz signal as part of a color burst phase lock loop. Alternatively, a 3.58 MHz LC oscillator circuit may be used with its center frequency stabilized during the vertical blanking interval, as described in U.S. Pat. No. 4,544,943 to Quan, by using a fixed 3.58 MHz crystal oscillator as a reference.

An LC circuit may not be used as a color burst ringing circuit (unless stabilized as described above) because the 8–10 cycle color burst (at 3.58 MHz) is repeated at a 15.7 KHz rate, yielding sidebands separated at 15.7 KHz intervals. If an LC ringing circuit drifts by 15.7 KHz or more, it will lock onto an upper or lower sideband (3.58 MHz ±15.7 KHz) rather than the reference frequency. Thus, a highly stable crystal-based circuit is required for this purpose.

SUMMARY OF THE INVENTION

In a voltage controlled oscillator according to this invention, the frequency range of the oscillator is broadened by replacing the single crystal with a multiple section bandpass filter containing a plurality of crystal or ceramic elements. In one embodiment, two or more crystals are connected in parallel conduction paths. The crystals have resonant frequencies which are at preselected intervals within a desired range. Alternatively, crystals having the same resonant frequency may be used if each of them is connected in series with a capacitor which alters the resonant frequency of the crystal-capacitor combination to one of the preselected frequencies. (Optionally, one of the crystals may be used at its natural frequency without a capacitor.) All of the crystals operate simultaneously. The oscillator is therefore distinguishable from prior art oscillators having multiple crystals which are switched into the circuit one at a time.

In a preferred embodiment, the parallel crystals are driven by separate transistors. In a first variation, the crystals share a common current summing node transistor, but have their outputs connected to separate amplifiers. In a second variation, the crystals are driven by separate driving transistors and have their outputs connected to separate amplifiers, whose outputs are then summed.

In an alternative embodiment, the crystals share a common driving transistor and have their outputs connected to a single current summing amplifier.

In another alternative embodiment, a multiple section crystal or ceramic bandpass filter is substituted for the arrangement of parallel-connected crystals.

The phase shift circuit used in the oscillators of this invention may include an LC circuit with a variable capacitance (varactor diode), or it may include single pole lead and lag networks.

A ringing circuit constructed in accordance with the principles of this invention, comprising two or more parallel crystals connected to a summing amplifier, is also disclosed.

An oscillator or ringing circuit in accordance with this invention is essentially a highly stable oscillating circuit with the equivalent of a lower Q (broader band). Moreover, it may use standard off-the-shelf crystals (AT cut, for example), rather than the more expensive crystals specially cut for use in VXCOs, while providing a greater range of frequency deviation than VXCOs using specially cut crystals.

DESCRIPTION OF THE INVENTION

Figure 4:
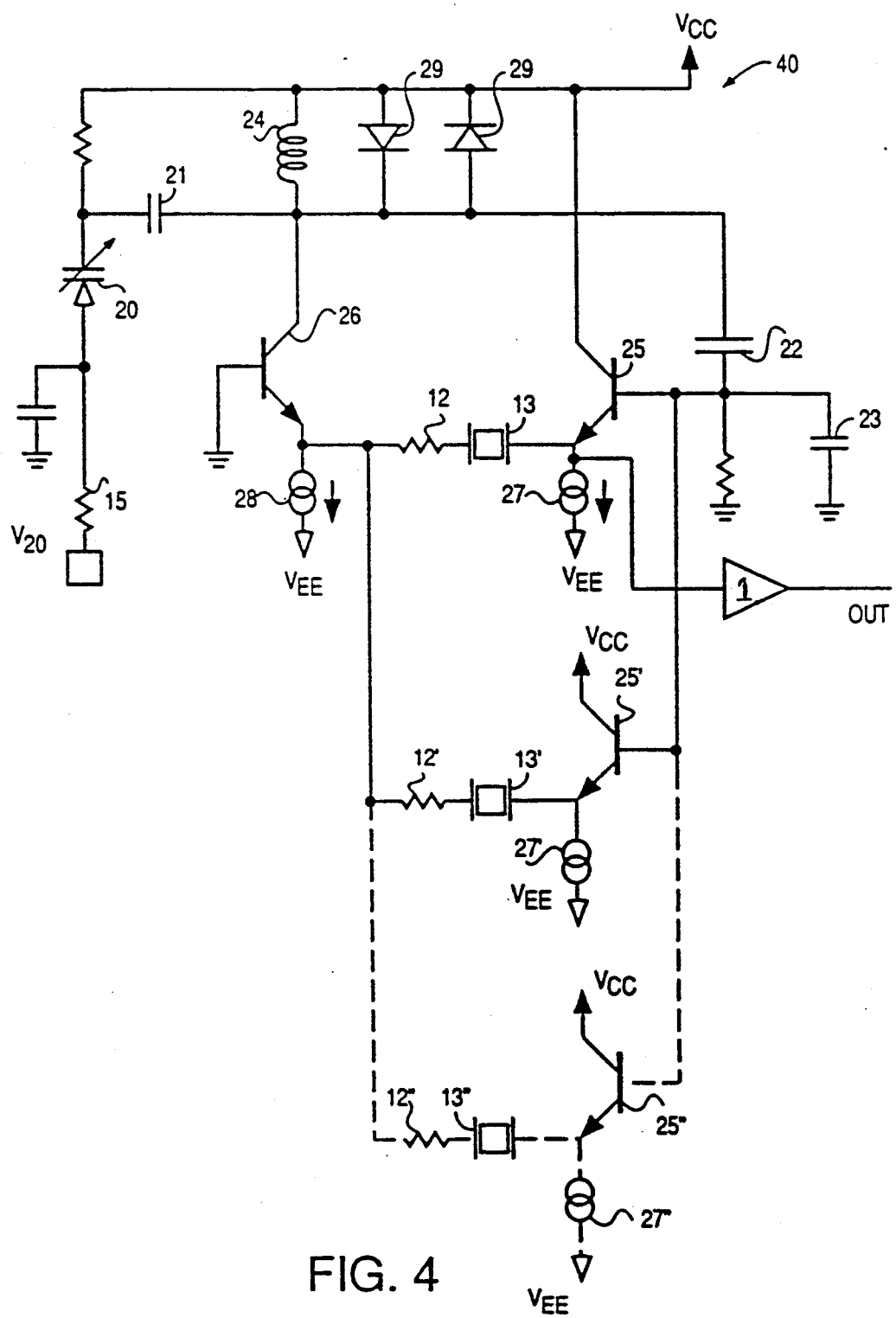
FIG. 4 illustrates an oscillator according to the invention.

FIG. 4 illustrates a preferred embodiment according to the invention. Oscillator 40 is similar to the oscillator illustrated in FIG. 2A, except that an additional driving emitter-follower transistor 25', a crystal 13' and a resistor 12' are connected to driving transistor 25. The emitter of driving transistor 25' is connected through a current source 27' to negative supply voltage $V_{EE}$, and the collector of driving transistor 25' is connected to positive supply voltage $V_{CC}$. Crystals 13 and 13' are driven in phase with each other. The varactor diode 20 has a relatively low ratio (e.g., 2:1) of maximum to minimum capacitance. Prior art oscillators require capacitance ratios as high as 40:1 (see, e.g., "Survey of Crystal Oscillators", Ham Radio, March 1976, FIGS. 34 and 35).

Figure 9A:
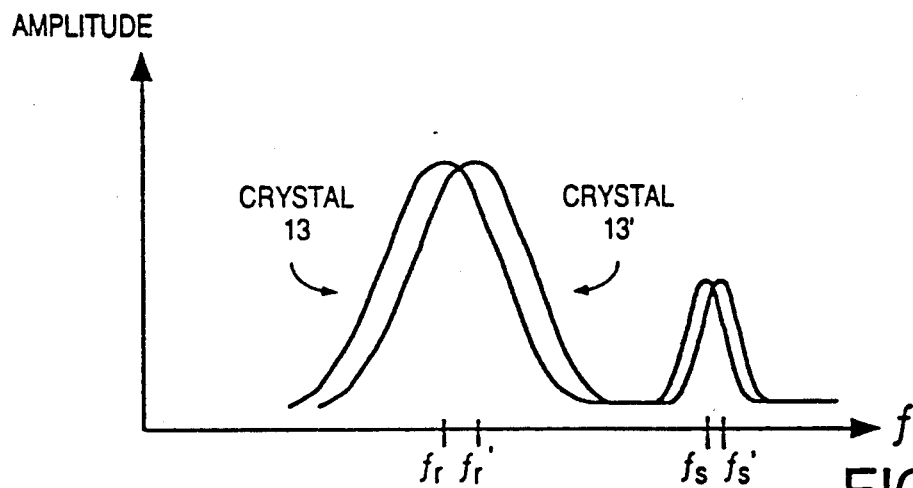
FIG. 9A–9C illustrate several characteristics of the crystals employed in the oscillators illustrated in FIGS. 4–7.

The resonant frequencies of crystals 13 and 13', respectively, (nominally about 15 MHz) are selected such that they are spaced at a predetermined interval (e.g., 3 KHz), as shown in FIG. 9A. FIG. 9A shows crystal 13 having a resonant frequency $f_r$ and crystal 13' having a resonant frequency $f_r'$. The spurious frequencies $f_s$ and $f_s'$ of crystals 13 and 13', respectively, are also shown.

Figure 9B:
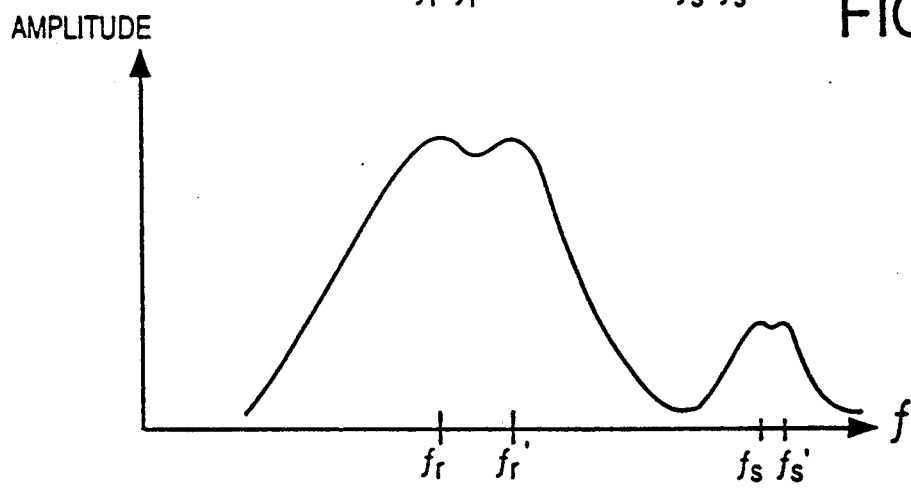

FIG. 9B illustrates the composite frequency response curve of the combination of crystals 13 and 13' illustrated in FIG. 4 when driven in phase. It is apparent that the curve of FIG. 9B is wider than the curve of FIG. 9A by a magnitude approximately equal to the difference between $f_r$ and $f'$. As a result, the operational range of oscillator 40, i.e., the distance between the frequency at which it shuts down and the frequency at which it jumps to a spurious frequency, is increased by approximately this amount. The range of an oscillator such as oscillator 40 which has two crystals has been found to be almost twice as great as the range of a single-crystal oscillator.

The frequencies of the crystals must not be spaced too far apart (e.g., for an oscillator having a frequency of around 15 MHz, ideally about 3 KHz, or 200 ppm) or the oscillator will jump from one frequency to another, and will not vary over a continuous band of frequencies between the crystal frequencies.

Figure 9C:
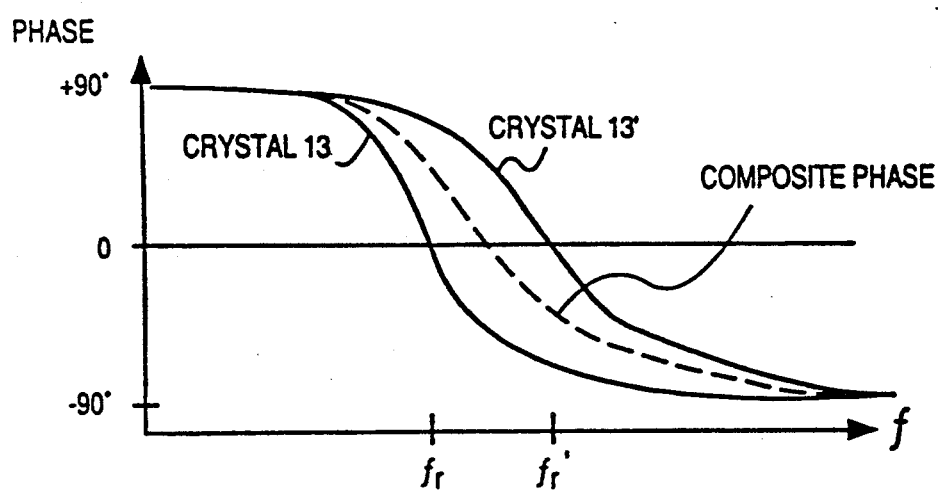

FIG. 9C illustrates a phase versus frequency curve for crystal 13, for crystal 13' and for the composite of crystals 13 and 13'. Resistors 12 and 12' function importantly to increase the frequency deviation of crystals 13 and 13' (from $f_r$ and $f_r'$ respectively) as a function of phase shift.

An advantage of the embodiment shown in FIG. 4 arises from the fact that crystals 13 and 13' are driven in phase separately by driving transistors 25 and 25', respectively. If transistor 25' were omitted from oscillator 40, by connecting the terminal of crystal 13' to the emitter of transistor 25 (as in FIG. 7, discussed below), the finite output impedance of transistor 25 might allow an interaction between crystals 13 and 13' as the frequency increases. The magnitude of resistors 12 and 12' is typically low (150-300 ohms), and with increasing frequency the output impedance of transistor 25 may rise to 20-50 ohms or even more, as the output impedance of transistor 25 increases with frequency due to its finite beta $f_t$. The resulting interaction between crystal 13 and crystal 13' may cause oscillator 40 to jump to the spurious frequency of either crystal as the oscillator tries to change frequency. This phenomenon has been observed empirically and is believed to occur because the currents through crystals 13 and 13' can cause minor voltage variations at the emitter of transistor 25 when the output impedance of transistor 2 is sufficiently high.

Figure 5:
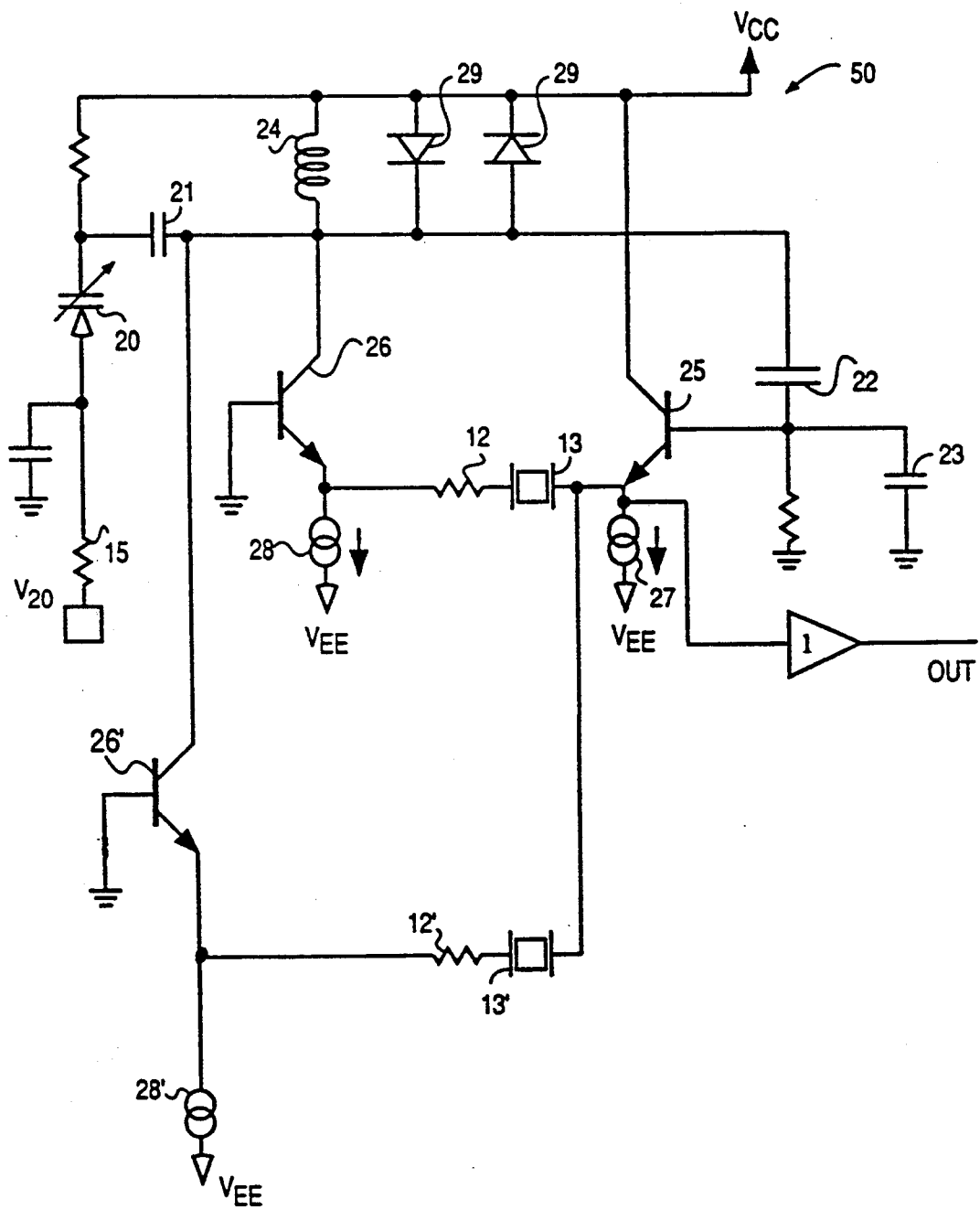
FIG. 5 illustrates a first variation of the oscillator shown in FIG. 4.

In a first variation of the preferred embodiment, illustrated in FIG. 5, this isolation is achieved by separating the termination paths of the crystal-resistor combinations. In oscillator 50, the terminals of crystals 13 and 13' are both tied to the emitter of driving transistor 25. The other side of the series combination of resistor 12' and crystal 13' is linked to the emitter of a summing transistor 26' and through a current source 28' to the negative voltage supply. Because the termination summing paths of crystals 13 and 13' are separate (Via the emitters of summing transistors 26 and 26'), oscillator 50 avoids interaction between crystals 13 and 13' and the consequent problems mentioned above.

Figure 6:
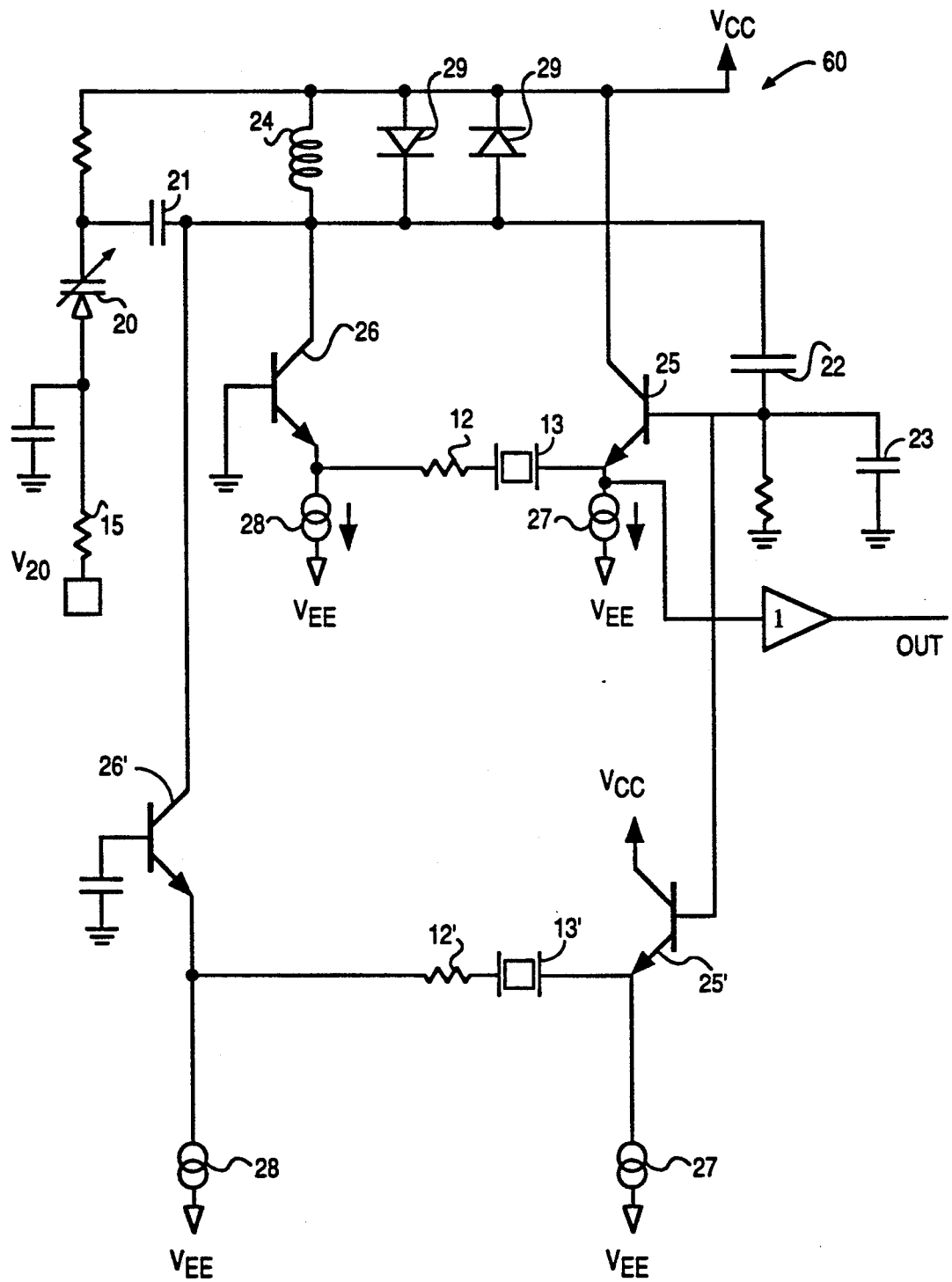
FIG. 6 illustrates a second variation of the oscillator shown in FIG. 4.

Oscillator 60 shown in FIG. 6 exhibits superior isolation between crystals 13 and 13'. Crystal 13 and crystal 13' are driven by separate driving transistors 25 and 25' in the manner of oscillator 40 shown in FIG. 4. Crystal 13 is connected through resistor 12 to the emitter of summing transistor 26, and crystal 13' is connected through resistor 12' to the emitter of summing transistor 26', in the manner of oscillator 50 shown in FIG. 5. Oscillator 60 is somewhat more expensive to construct, but it exhibits greater isolation between crystals 13 and 13' than either oscillator 40 or oscillator 50.

More than two crystals may be used where an even broader operational range is required for the oscillator. For example, FIG. 4 shows (in broken lines) a series combination of a resistor 12", crystal 13" and a driving transistor 25" connected in parallel with the resistor-crystal-transistor combinations described above. Similarly, additional crystals may be connected into the embodiments illustrated in FIGS. 5 and 6.

Figure 7:
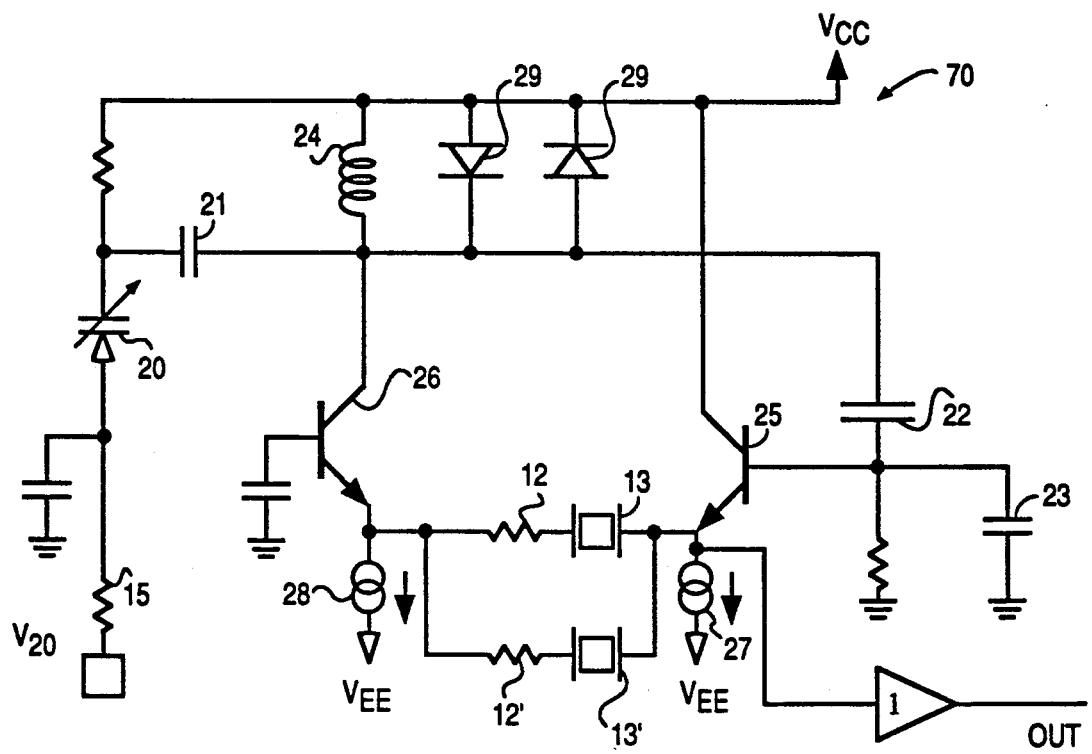
FIG. 7 illustrates an alternative embodiment according to the invention.

FIG. 7 shows a simplified alternative embodiment according to the invention. In oscillator 70, the combination of resistor 12 and crystal 13 is connected in parallel with the combination of resistor 12' and crystal 13'. This parallel circuit is linked to the emitter of driving transistor 25 and the emitter of transistor 26. Depending on the frequency at which it operates, oscillator 70 may show some of the interaction problems between crystals 13 and 13' that were described above. As a result, oscillator 70 is more likely to jump to a spurious frequency than the embodiments described above if the frequency deviation is large. However, oscillator 70 is less expensive to construct than oscillators 40, 50 or 60, and it may show satisfactory performance in certain applications.

Figure 8A:
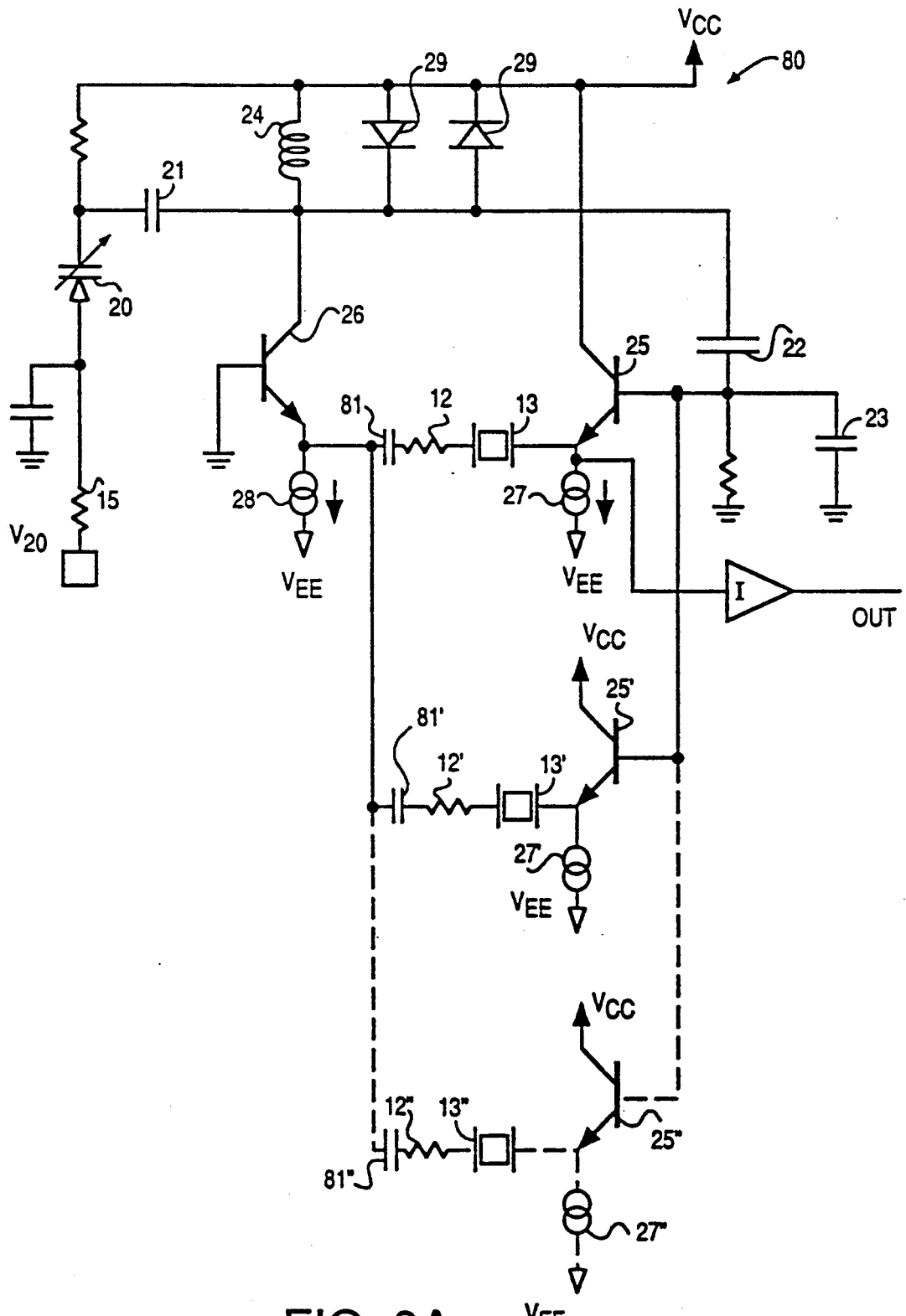
FIG. 8A illustrates an oscillator constructed with crystals having the same resonant frequency.

Crystals having the same resonant frequency may be used if capacitors are connected in series with them. An example is shown in FIG. 8A, which is identical to FIG. 4 except that oscillator 80 has a capacitor 81 connected to resistor 12 and crystal 13, a capacitor 81' connected to resistor 12' and crystal 13', and a capacitor 81" connected to resistor 12" and crystal 13". The values of capacitors 81-81" are selected such that each of the crystal-resistor-capacitor combinations of which they are a part has a desired resonant frequency.

In an experiment with oscillator 80 shown in FIG. 8A, resistors 12 and 12' each had a resistance of 270 Ω, capacitors 81 and 81' had values of 470 pF and 18 pF, respectively, and crystals 13 and 13' had series resonant frequencies of 17.734 MHz. With this circuit, a frequency range of +5 KHz to −6 KHz was obtained, equivalent to −340 ppm to +280 ppm. VXCOs typically have frequency ranges of less than ±170 ppm. (The path containing crystal 13" was not included in the experimental device, but adding more crystals would increase the frequency range further.)

Figure 8B:
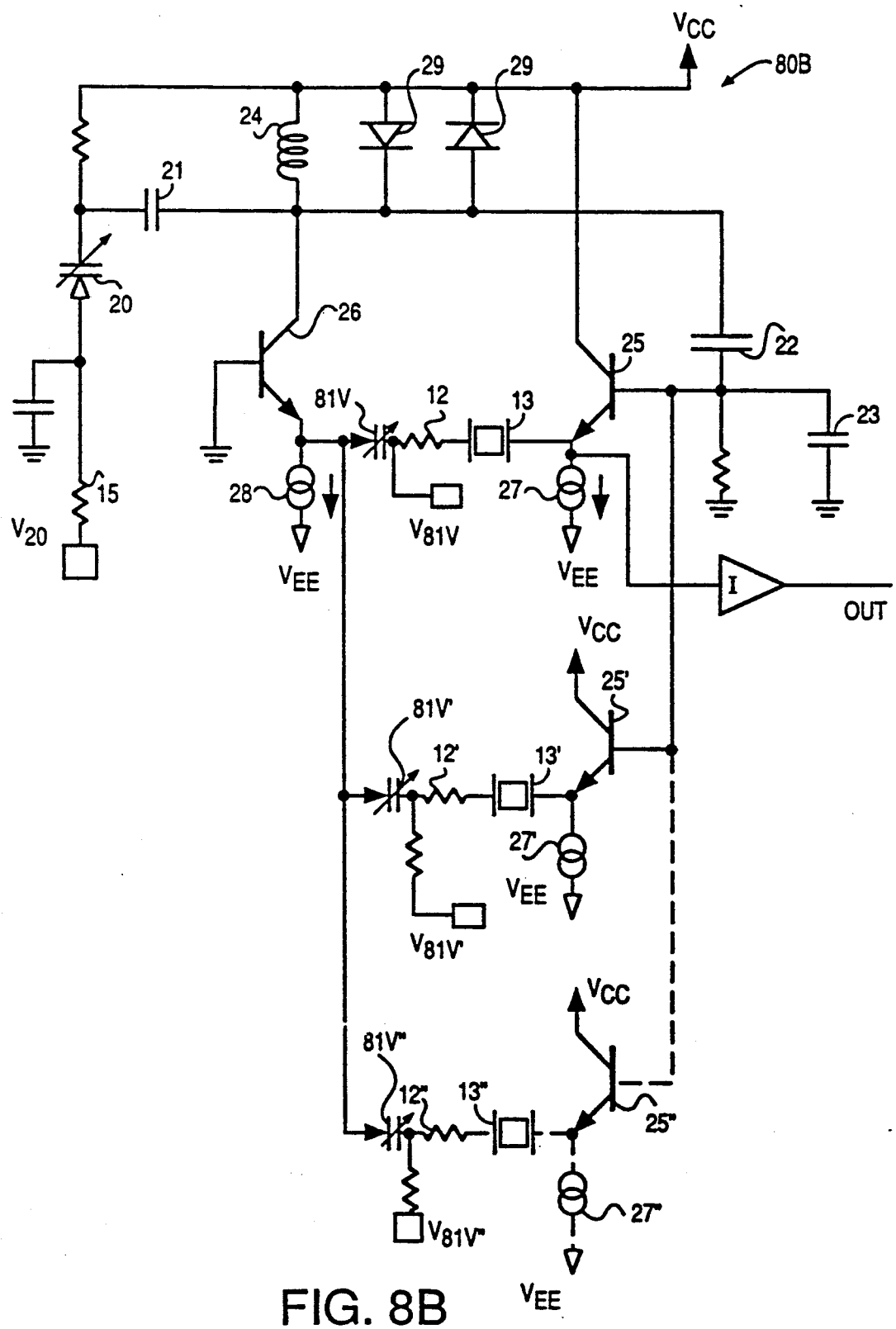
FIG. 8B illustrates the oscillator of FIG. 8A modified to contain variable capacitors.

The frequency range of oscillator 80 may be increased further by connecting varactor diodes in place of capacitors 81-81". This structure is illustrated in FIG. 8B, which shows an oscillator 80B. Oscillator 80B is identical to oscillator 80 except that a varactor diode 81V is connected to resistor 12 and crystal, a varactor diode 81V' is connected to resistor 12' and crystal 13', and a varactor diode 81V" is connected to resistor 12" and crystal 13". The capacitance of varactor diodes 81V, 81V' and 81V" are controlled by control voltages $V_{81V}$, $V_{81V'}$, and $V_{81V''}$ respectively. An increased frequency range is achieved by varying control voltages $V_{81V-81V''}$ in conjunction with $V_{20}$. Control voltages $V_{81V}-V_{81V''}$ may actually be linked to $V_{20}$, but this is not necessary.

Figure 1:
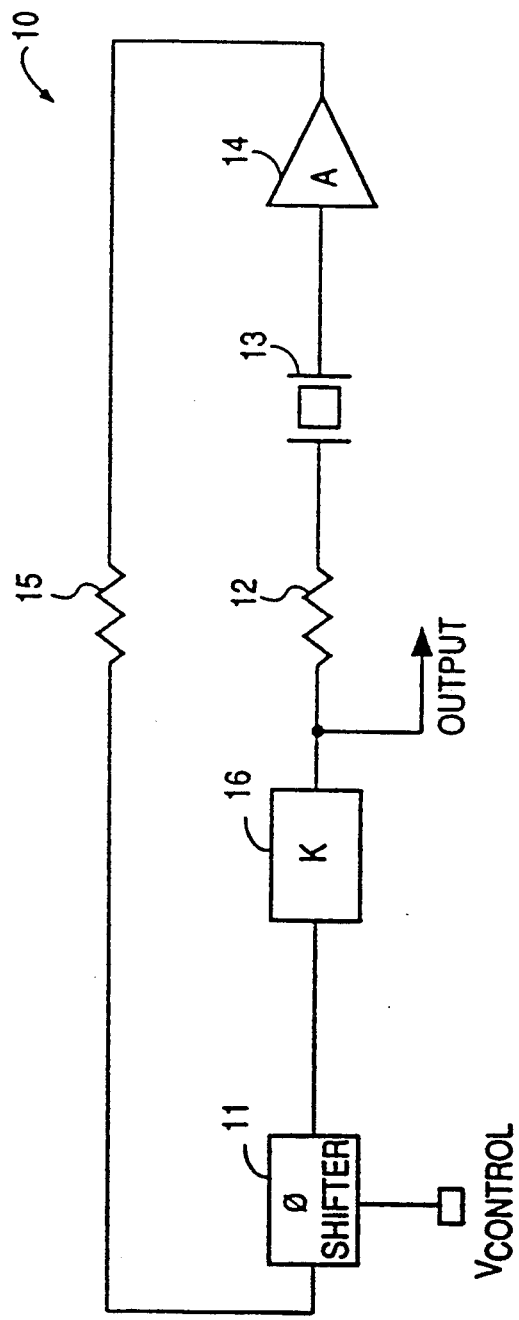
FIG. 1 illustrates a block diagram of a known crystal oscillator.
Figure 2A:
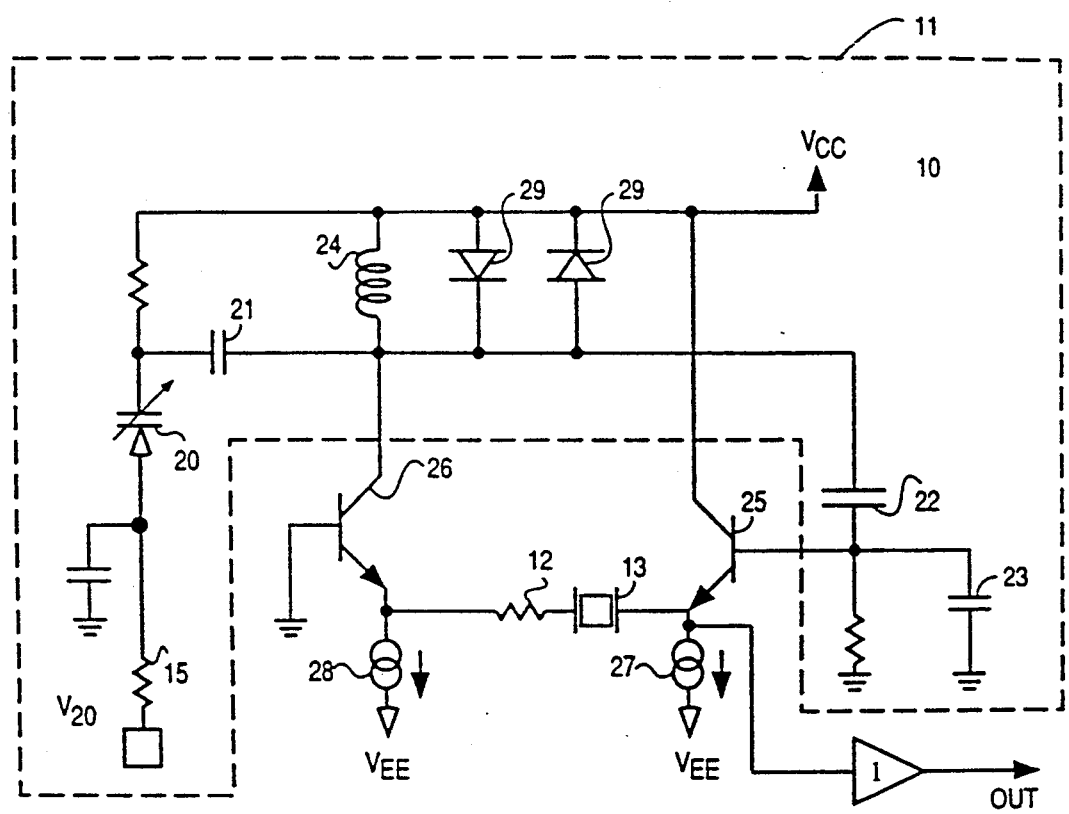
FIG. 2A illustrates a circuit diagram of the oscillator shown in FIG. 1.
Figure 2B:
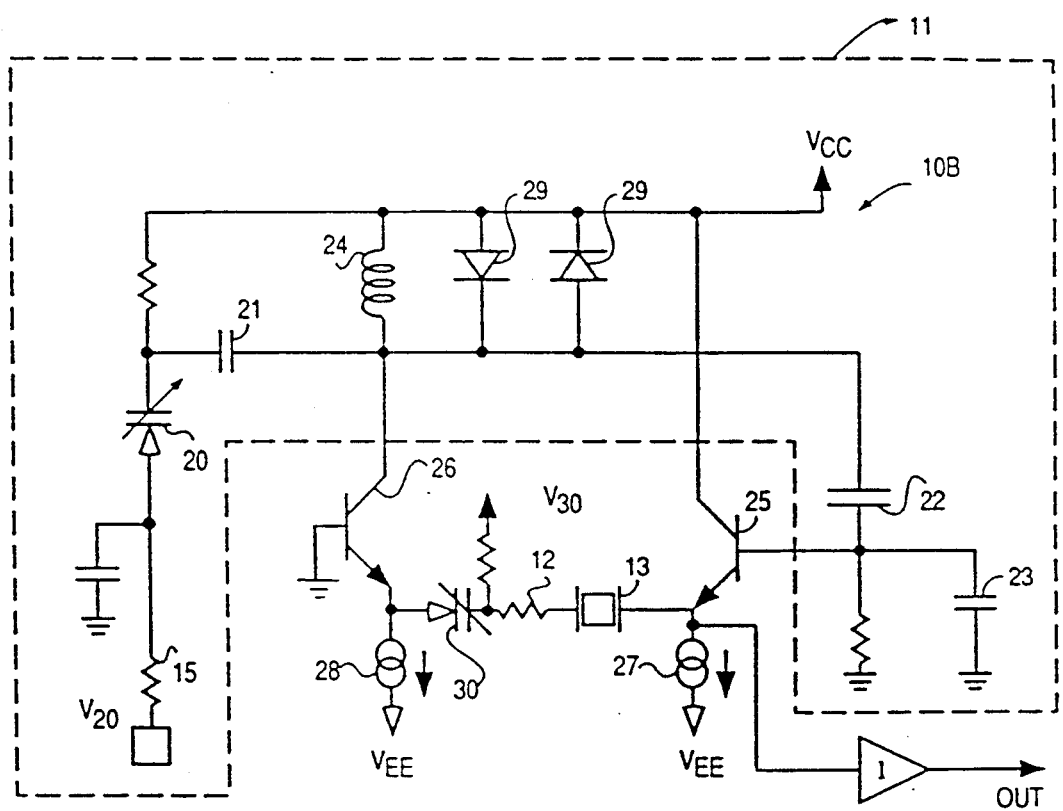
FIG. 2B illustrates the oscillator of FIG. 2A modified in accordance with this invention.
Figure 3A:
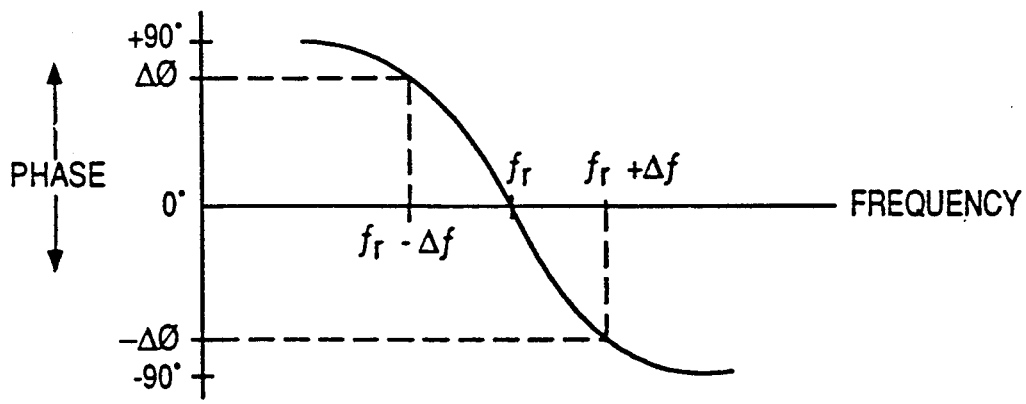
FIG. 3A illustrates the variation of the frequency of a crystal as a function of phase.
Figure 3B:
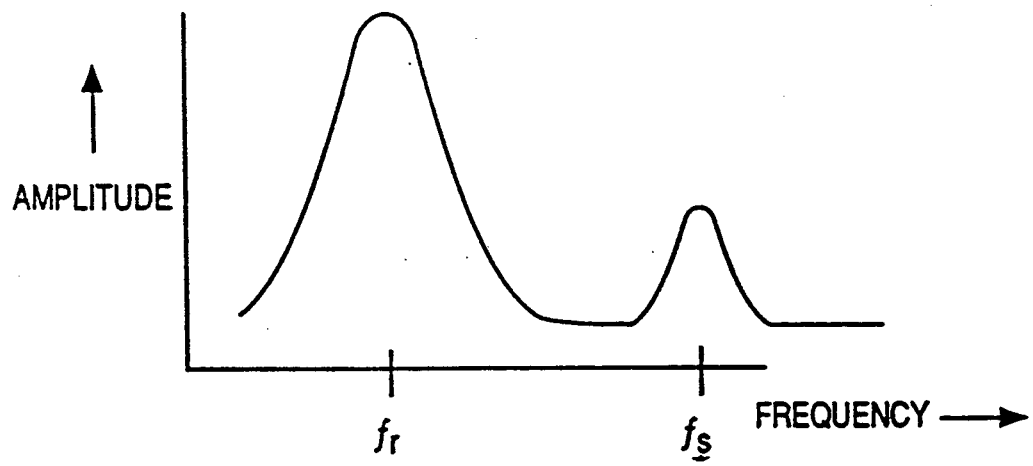
FIG. 3B illustrates the variation of its amplitude as a function of frequency.

FIG. 2B shows an oscillator 10B which is a modification of the prior art oscillator 10 shown in FIG. 2A. Oscillator 10B includes a varactor diode 30 connected to resistor 12 and crystal 13. Varactor diode 30 is controlled by a control voltage $V_{30}$. Control voltage $V_{30}$ may or may not be linked to $V_{20}$. It has been found that oscillator 10B has a frequency range over 20% broader than oscillator 10 when $V_{30}$ and $V_{20}$ are tied together.

The oscillator of this invention may be used in a variety of applications where a highly stable, wide range oscillator is required: for example, as a TV monitor subcarrier phase lock loop (PLL) oscillator; as a master clock generator for digital TV processing systems that tracks the frequency of the incoming waveform; and as the incoming tape subcarrier regeneration circuit in demodulation-remodulation and heterodyne color stabilizers.

Figure 10A:
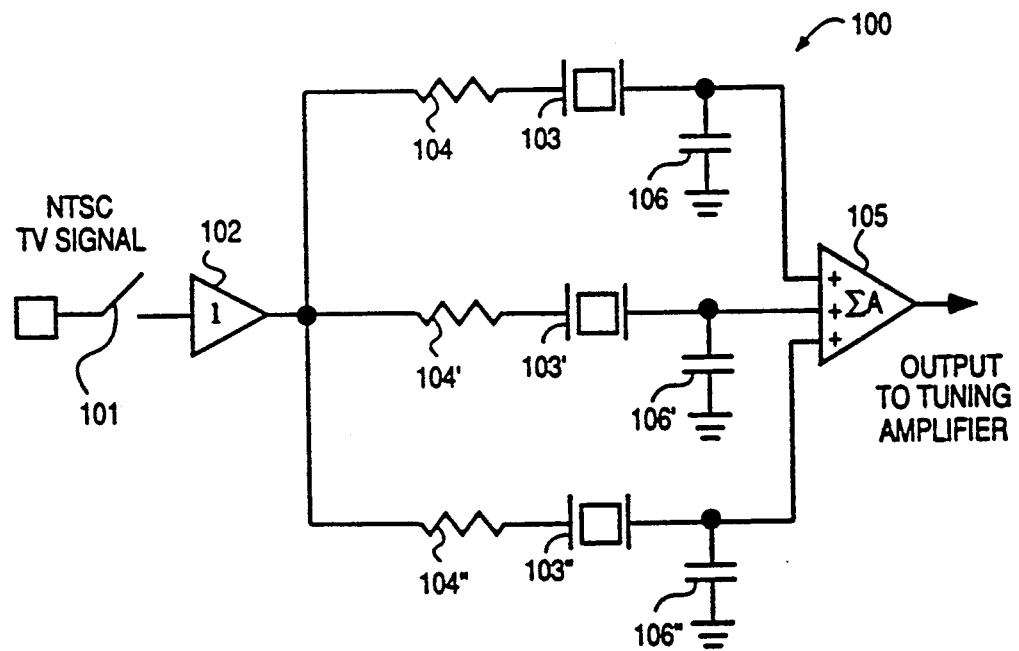
FIG. 10A illustrates a ringing circuit according to the invention.

The principles of the invention are also applicable to color burst ringing circuits. FIG. 10A illustrates a color burst ringing circuit 100 in accordance with the invention which has a broad frequency range and is therefore particularly suitable for use with VCRs. In ringing circuit 100, a television signal including color bursts is fed through a burst gate 101 and a voltage amplifier 102. The output of amplifier 102 is passed to three parallel branches containing crystals 103, 103' and 103", respectively. Resistors 104, 104' and 104" are connected to crystals 103, 103', and 103", respectively, and the outputs of crystals 103-103' are delivered to the input terminals of an amplifier 105, which is a high input impedance summing amplifier. Capacitors 106, 106' and 106", respectively, connect the input terminals of amplifier 105 to ground.

Figure 10B:
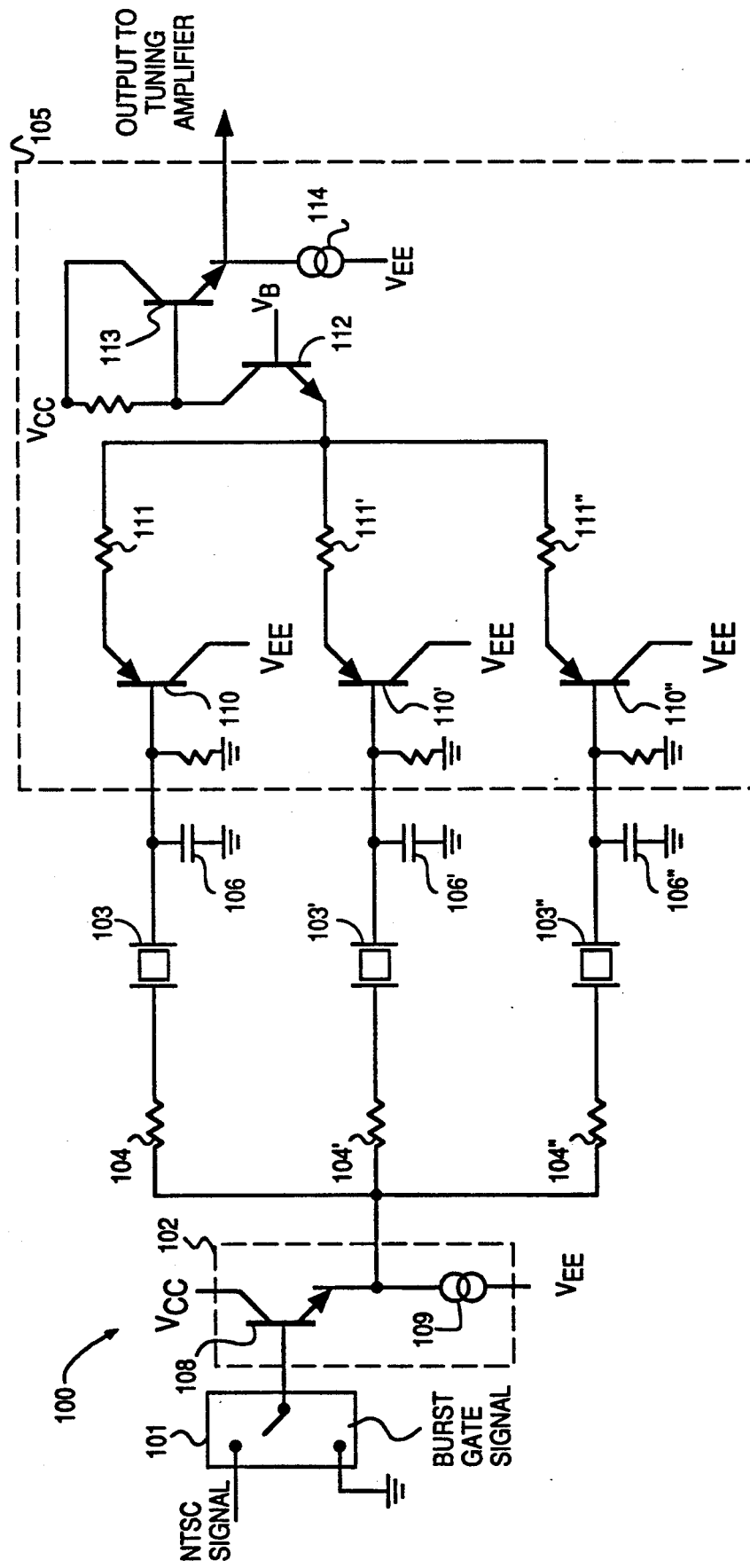
FIG. 10B illustrates a more detailed circuit diagram of the ringing circuit shown in FIG. 10A.

A circuit diagram of color burst ringing circuit 100 is illustrated in FIG. 10B. The color video (NTSC) signal is delivered to burst gate 101. Burst gate 101 transmits the color burst when a burst gate signal is present; otherwise burst gate 101 is grounded. Voltage amplifier 102 includes an emitter-follower transistor 108 which is connected to a current source 109. Amplifier 102 has a gain of 1 and drives the circuitry in the parallel branches containing crystals 103-103". Transistors 110, 110' and 110" in amplifier 105 are emitter-follower buffers similar to transistor 108, and buffer the voltages across capacitors 106-106", respectively. Resistors 111, 111' and 111" are summing resistors, the other sides of which are connected in common to the emitter (input) of a summing amplifier transistor 112. The sum of the outputs of resistors 111-111" appears at the collector of transistor 112. From there it is sent through an emitter-follower transistor 113 to the output of ringing circuit 100.

Current sources 109 and 114 serve to bias transistors 108 and 113, respectively. The voltage $V_B$ at the base of transistor 112 is generally a few volts so that current flows through resistors 111-111" to bias transistors 110-110", respectively. Resistors 111-111" are normally equal in value but this need not be the case.

In color burst ringing circuit 100, crystal 103 is tuned to the reference frequency $f_{sc} \approx 3.58$ MHz of the color burst signal, crystal 103' is tuned to $f_{sc}-1$ KHz, and crystal 103" is tuned to $f_{sc}+1$ KHz. The values of resistors 104-104" are in the range of 100-500 ohms. Color burst ringing circuit 100 is capable of following the expected fluctuations in the frequency of the color burst signal without locking onto the sidebands which are separated by about 15.7 KHz from the 3.58 MHz reference frequency.

Figures 11A, 11B:
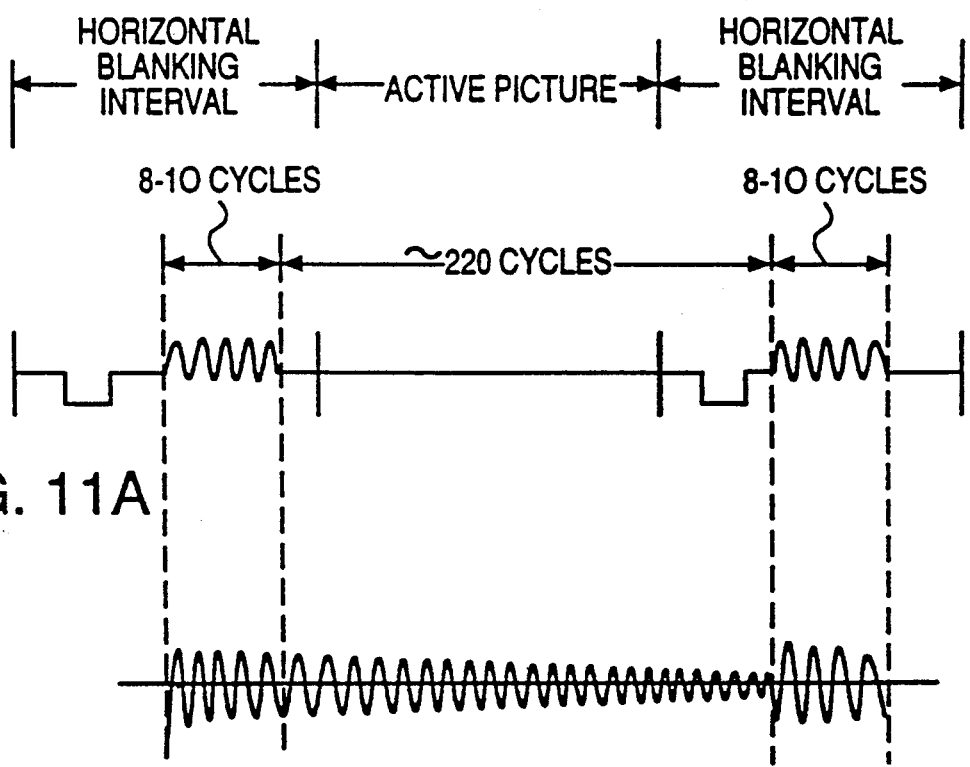
FIG. 11A and 11B illustrate the color burst portion of a television signal, and the response of the ringing circuit of FIG. 10A to the color burst.

In operation, ringing circuit 100 receives the color bursts through gate 101, and delivers an output at the output terminal of amplifier 105, which is normally connected to color demodulation circuitry. FIG. 11B illustrates the response of ringing circuit 100 to the color bursts in the horizontal blanking interval.

Figure 12A:
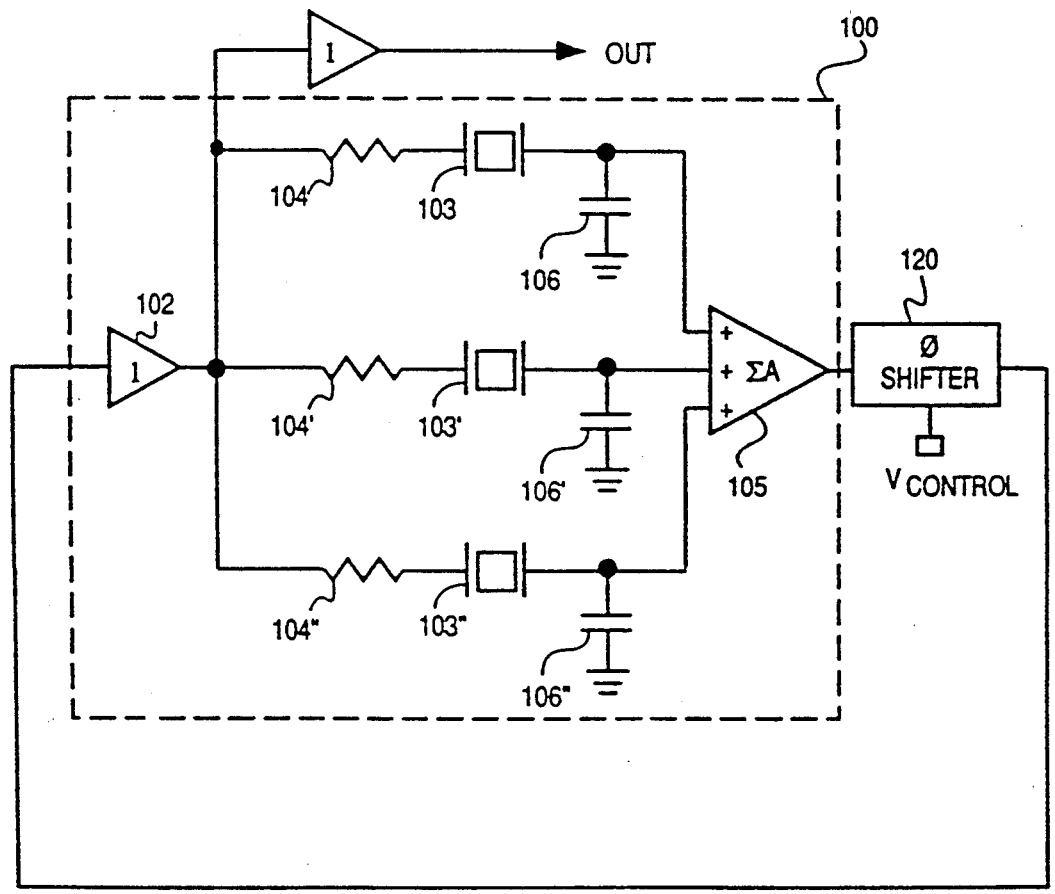
FIG. 12A illustrates a wide frequency deviation VXCO using the ringing circuit illustrated in FIG. 10A.
Figure 12B:
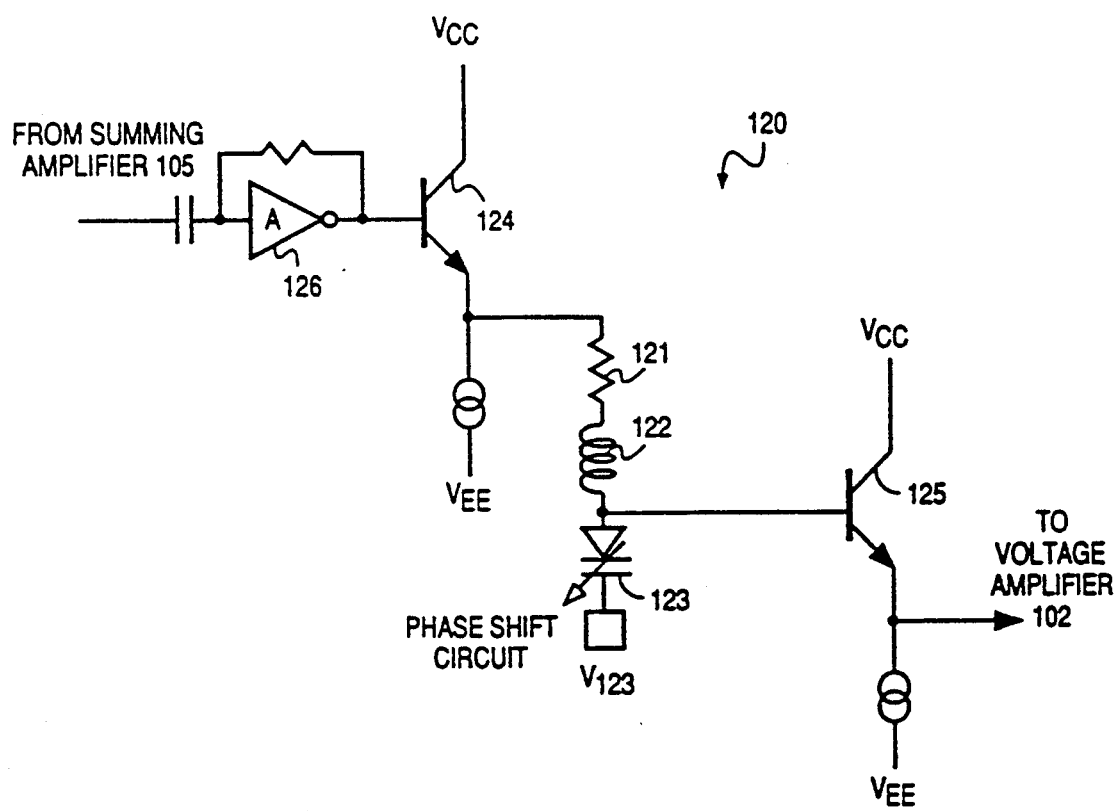
FIG. 12B illustrates the phase shift circuit used in the VXCO of FIG. 12A.

FIG. 12A illustrates ringing circuit 100 used in a wide frequency deviation crystal oscillator. The circuitry of amplifier 102 and summing amplifier 105 are as shown in FIG. 10B. The structure of phase shift circuit 120 is shown in FIG. 12B. At or near the resonant frequency of crystals 106-106", the RLC combination of resistor 121, inductance 122 and varactor diode 123 has a phase shift of approximately $-90°$. Transistors 124 and 125 are buffer amplifiers having a gain of 1. Amplifier 126 is a CMOS inverter or equivalent inverting amplifier which has a phase shift of $-180°$ and a gain much larger than 1. Thus, taken as a whole, phase shift circuit 120 has a nominal phase shift of $-270°$, which can be varied by adjusting the control voltage $V_{123}$ delivered to varactor diode 123, and a gain much greater than 1. Since the combination of 103-103" crystals and capacitors 106-106" has a phase shift of $-90°$, the total phase shift of the oscillator shown in FIG. 12A is close to $-360°$, and the oscillator has a gain greater than 1. Adjusting the control voltage $V_{123}$ delivered to varactor diode 123 changes the phase of phase shift circuit 120 and thereby alters the frequency of the oscillator.

Figure 12C:
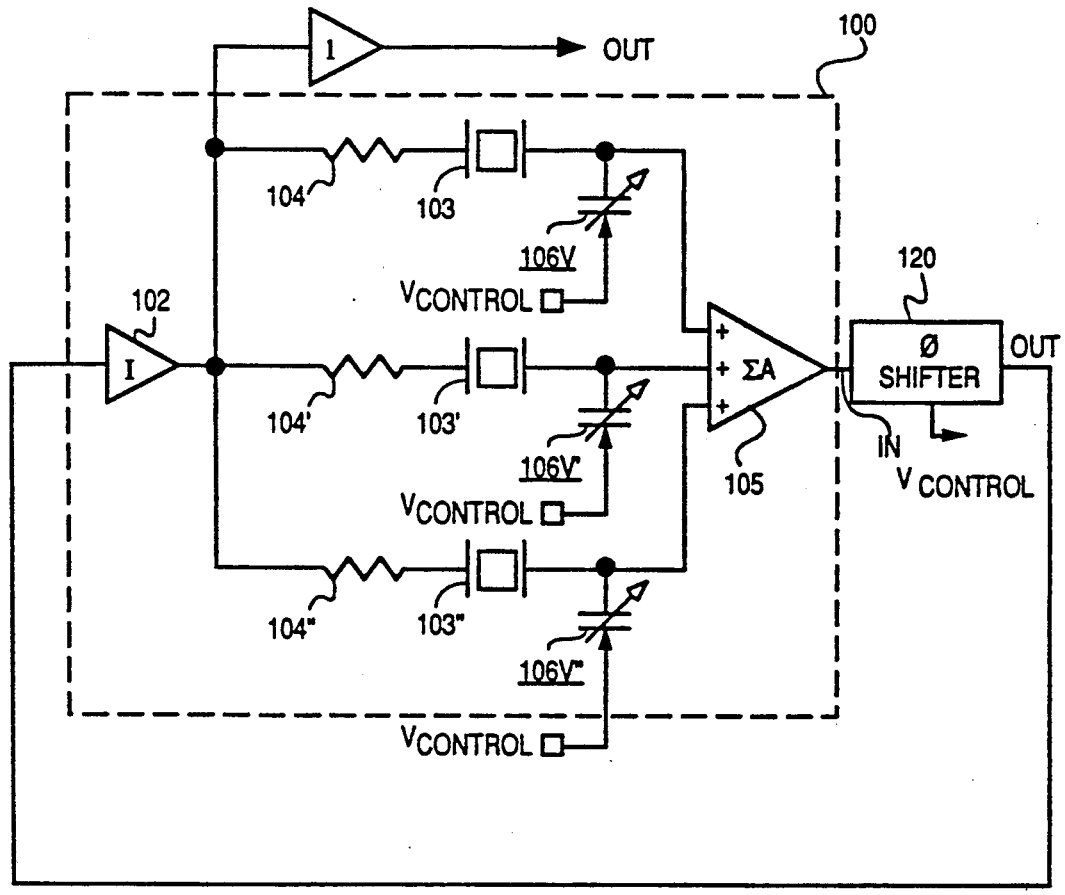
FIG. 12C illustrates an alternative embodiment of the VXCO of FIG. 12A which has an even wider frequency range.

As shown in FIG. 12C, additional frequency deviation in the oscillator of FIG. 12A may be obtained by substituting varactor diodes 106V, 106V' and 106V" for fixed capacitors 106, 106' and 106".

Figure 13:
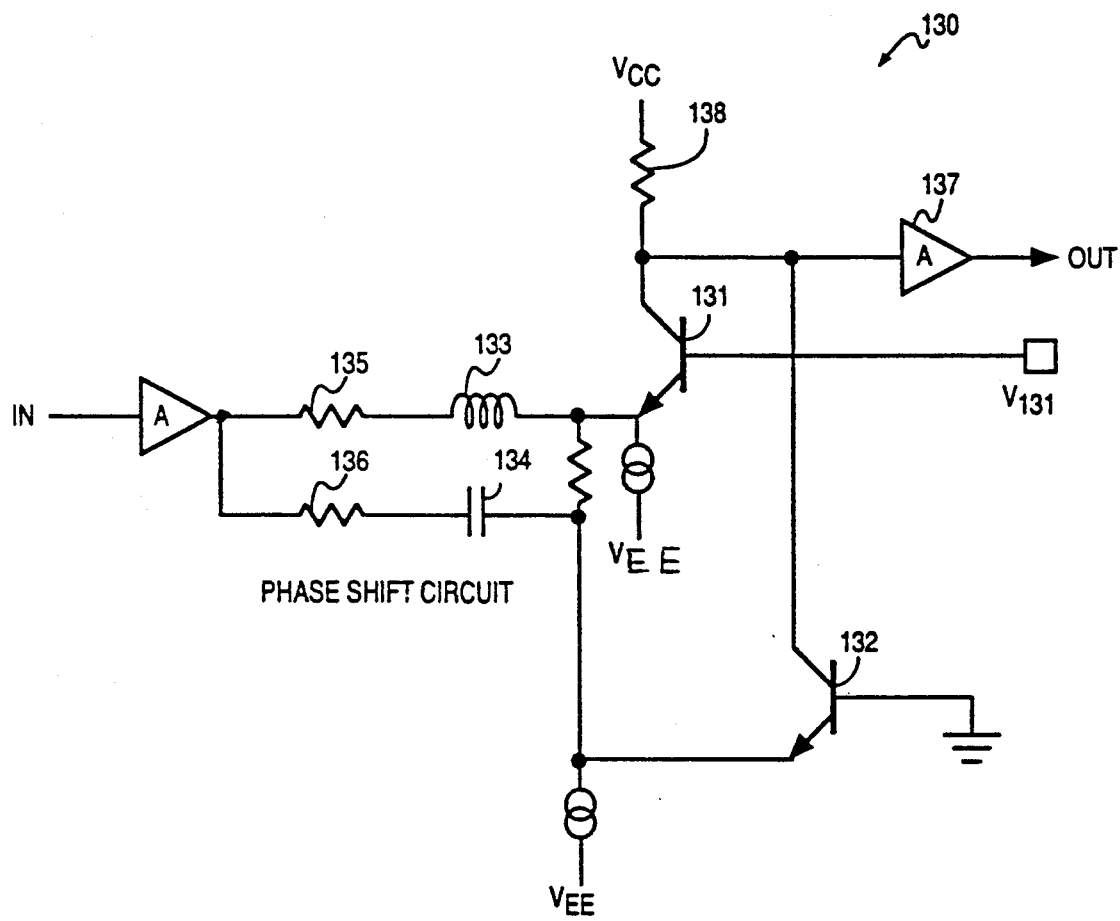
FIG. 13 illustrates an alternative form of phase shift circuit.

FIG. 13 illustrates a phase shift circuit 130 which may be used in place of phase shift circuit 11 (FIG. 2B) In phase shift circuit 130, the combination of a resistor 135 and an inductance 133 provides a lag current to the collector of a transistor 131. The combination of a resistor 136 and a capacitor 134 provides a lead current to the collector of a transistor 132. The collectors of transistors 131 and 132 are coupled and passed to an input of a unity gain buffer 137. A control voltage $V_{131}$ is applied to the base of transistor 131. When $V_{131}$ is negative, the output has a positive phase shift because transistor 131 is turned off. When $V_{131}$ is positive, the output has a negative phase shift because transistor 132 is turned off. When $V_{131}$ is zero, transistors 131 and 132 provide equal positive and negative phase shift, so the 0 output has no net phase shift. Thus phase shift circuit 130 essentially adds differing amounts of positive and negative phase shift from single pole lead and lag networks. This provides superior linearity of phase versus control voltage as compared with the resonating RLC varactor circuit illustrated in FIG. 12B. This in turn improves the linearity of the oscillator frequency as a function of control voltage. Circuit 130 may also be used in place of phase shift circuit 120 (FIGS. 12A and 12B) if circuit 130 is modified by adding another $+90°$ of phase shift. This can be done by replacing resistor 138 with an inductance. A phase shift network of the kind shown in FIG. 13 is also shown in FIG. 4-20 of the Service Manual for the International Video Corporation IVC-900 Video Tape Recorder (February, 1972).

Figure 14:
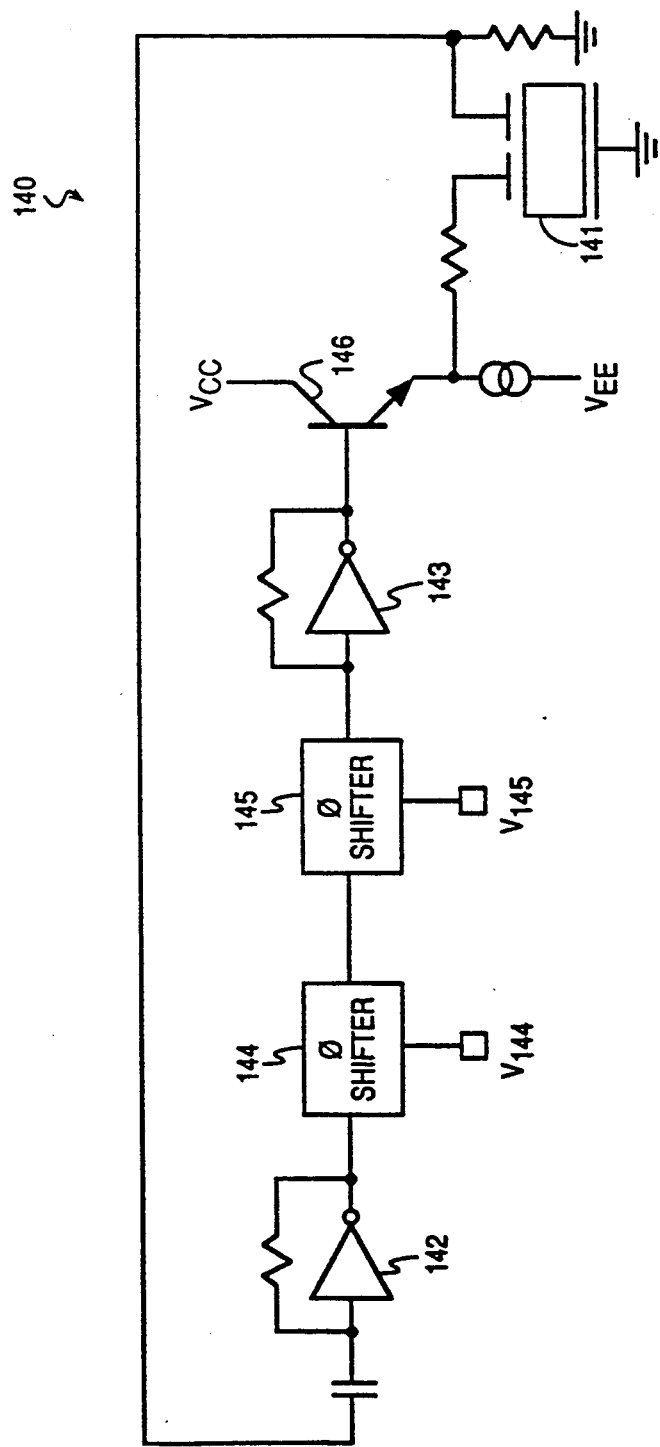
FIG. 14 illustrates an alternative form of oscillator which includes a multiple section crystal or ceramic bandpass filter.

FIG. 14 illustrates an oscillator 140 which includes a multiple section bandpass filter 141. Multiple section bandpass filter 141 may be either a crystal or ceramic bandpass filter but it must have a phase shift between $-180°$ and $+180°$ in the pass band. For example, a 455 KHz multisection ceramic bandpass filter may be used (e.g., Toko part CFM2, (part number HCFM2-455D) dual (section) resonating element filter). Inverters 142 and 143 are CMOS inverters which are provided for amplification. Inverters 142 and 143 each provide a phase shift of $-180°$, or a total of $-360°$ (equivalent to $0°$ phase shift). Oscillator 140 also includes phase shift circuits 144 and 145 and a buffer transistor 146.

As the phase shift applied by phase shift circuits 144 and 145 is varied by adjusting the control voltages $V_{144}$ and $V_{145}$, bandpass filter 141 is forced to an equal but opposite phase shift so that the total phase shift in the oscillator remains at −360° (0°), and thus oscillator 140 moves to a new frequency. Two phase shift circuits 144 and 145 are included to increase the frequency range of the oscillator, because many multisection crystal and ceramic filters require a phase shift of more than 90° to take advantage of their entire frequency range. (Compare FIG. 9C, which shows a phase shift of 90° to be sufficient to take advantage of the frequency range of a single crystal.) However, a single phase shift circuit may be used in some circumstances. If bandpass filter 141 has a phase shift which is less than −180° or greater than 180° in the pass band, the oscillations of oscillator 140 may stop or power up to an unreliable frequency.

Phase shift circuits 144 and 145 may be either the RLC type illustrated in FIG. 12B or the more linear version illustrated in FIG. 13.

In order to achieve a broad frequency range, a multiple section crystal or ceramic bandpass filter may be substituted for the parallel-connected crystals in the ringing circuit shown in FIG. 10A.

The above disclosures are intended to be illustrative only, and not limiting, and many alternative embodiments will be apparent to those skilled in the art. The broad principles of this invention, as defined in the claims, are intended to include all such alternative embodiments. For example, ceramic resonators may be substituted for the individual crystals in circuits according to this invention. The circuits described may be further stabilized in frequency against changes in temperature by using temperature compensated capacitors and/or inductances or by superimposing a temperature-dependent voltage on the control voltages provided to the varactor diodes. Moreover, the frequency of a crystal oscillator may also be varied by changing the control voltages on the varactor diodes (e.g., 81V, 81V' and 81V" in FIG. 8B), while leaving the phase shift circuit at a fixed phase (e.g., 0°).

I claim:

1. A wide frequency deviation oscillator for providing an output signal throughout a continuous range of frequencies, said oscillator comprising:
a crystal or ceramic bandpass filter, said bandpass filter containing a plurality of crystals or ceramic resonators and a plurality of parallel conduction paths, one of said crystals or ceramic resonators being connected in each of said parallel conduction paths, each of said conduction paths having a resonant frequency, said resonant frequencies differing from one another by one or more selected intervals and each of said resonant frequencies lying within said continuous range of frequencies;
a phase shifting means; and
an amplifier;
said bandpass filter, said phase shifting means and said amplifier being connected in series in a loop.

2. A wide frequency deviation oscillator for providing an output signal throughout a continuous range of frequencies, said oscillator comprising:
a crystal or ceramic bandpass filter, said bandpass filter containing a plurality of crystal or ceramic resonators and a plurality of parallel conduction paths, one of said crystal or ceramic resonators being connected in each of said parallel conduction paths;
a phase shifting means; and
an amplifier;
said bandpass filter, said phase shifting means and said amplifier being connected in series in a loop, said oscillator not containing an inductive element in parallel with said parallel conduction paths;
said oscillator providing an output throughout said continuous range of frequencies.

3. The oscillator of claims 1 or 2 wherein each of said crystals or ceramic resonators has a resonant frequency which differs from the respective resonant frequencies of others of said crystals or ceramic resonators by one or more selected intervals within said range of frequencies.

4. The oscillator of claims 1 or 2 wherein there are N of said crystals or ceramic resonators each of which has substantially the same resonant frequency, at least N-1 of said conductive paths containing a capacitive means connected to the crystal or ceramic resonator in said conduction path to form a combination with said crystal or ceramic resonator.

5. The oscillator of claim 4 wherein each of said combinations has a resonant frequency which differs from respective resonant frequencies of the others of said combinations.

6. The oscillator of claim 5 wherein each of said capacitive means comprises a varactor diode.

7. The oscillator of claims 1 or 2 wherein each of said parallel conduction paths includes a driving transistor for driving the crystal or ceramic resonator in said conduction path.

8. The oscillator of claims 1 or 2 wherein each of said parallel conduction paths includes a summing transistor.

9. The oscillator of claim 7 wherein each of said parallel conduction paths includes a summing transistor.

10. The oscillator of claims 1 or 2 wherein said conduction paths share a common driving transistor for driving said crystals and a common summing transistor.

11. The oscillator of claims 1 or 2 wherein each of said conduction paths contains a resistor connected in series with the crystal in said conduction path.

12. The oscillator of claims 1 or 2 wherein said phase shifting means comprises a varactor diode connected to an LC circuit.

13. The oscillator of claims 1 or 2 wherein said phase shifting means comprises an inductance for providing a lag current to a first transistor, a capacitance for providing a lead current to a second transistor, means for adjusting the current flow through at least one of said first and second transistors, and means for summing respective outputs from said first and second transistors.

14. The oscillator of claim 6 wherein said phase shifting means comprises an inductance for providing a lag current to a first transistor, a capacitance for providing a lead current to a second transistor, means for adjusting the current flow through at least one of said first and second transistors, and means for summing respective outputs from said first and second transistors.

15. The oscillator of claims 1 or 2 wherein said multiple section crystal or ceramic bandpass filter comprises a multiple section crystal filter.

16. The oscillator of claim 15 wherein said bandpass filter has a pass band and provides a phase shift of between −180° and +180° in its pass band.

17. The oscillator of claim 15 comprising a pair of inverter means connected in said loop.

18. The oscillator of claims 1 or 2 wherein said multiple section crystal or ceramic bandpass filter comprises a multiple section ceramic bandpass filter.

19. The oscillator of claim 18 wherein said bandpass filter has a pass band and provides a phase shift of between −180° and a +180° in its pass band.

20. The oscillator of claim 18 comprising a pair of inverter means connected in said loop.

21. A resonant circuit operative to resonate at a frequency within a continuous range of frequencies, said resonant circuit comprising a plurality of crystals and a plurality of parallel conduction paths, one of said crystals being connected into each of said conduction paths, and a summing amplifier, one end of each of said conduction paths being connected to an input of said summing amplifier, each of said conduction paths having a resonant frequency, said resonant frequencies differing from one another by one or more selected intervals and each of said resonant frequencies lying within said continuous range of frequencies.

22. The resonant circuit of claim 21 comprising a voltage amplifier, the other end of each of said conduction paths being connected to an output of said voltage amplifier, and gating means connected to an input of said voltage amplifier.

23. The resonant circuit of claim 22 wherein said circuit comprises a color burst ringing circuit for a television receiver.

24. The resonant circuit of claim 21 wherein each of said conduction paths contains a resistor connected in series with the crystal in said conduction path.

25. An oscillator comprising the circuit of claim 21, said oscillator further comprising a voltage amplifier, the other end of each of said conduction paths being connected to an output of said voltage amplifier, and a phase shifting means connected between an output of said summing amplifier and an input of said voltage amplifier.

26. The oscillator of claim 25 wherein said phase shifting means comprises a varactor diode connected in series with an inductance and a resistance.

27. The oscillator of claim 25 wherein said phase shifting means comprises an inductance for providing a lag current to a first transistor, a capacitance for providing a lead current to a second transistor, means for adjusting the current flow through at least one of said first and second transistors, and means for summing respective outputs from said first and second transistors.

28. The oscillator of claim 25 comprising a plurality of variable capacitors, one of said variable capacitors being connected to each of said conduction paths.

29. A method of generating an oscillating voltage signal within a continuous range of frequencies, said method comprising the steps of:
providing a plurality of parallel conduction paths, each of said conduction paths containing a crystal, each of said conduction paths having a resonant frequency, said resonant frequencies differing from one another by selected intervals and each of said resonant frequencies lying within said continuous range of frequencies;
connecting said parallel conduction paths in a series loop with a phase shifting means; and
applying a supply voltage to said loop.

30. The method of claim 29 wherein said crystals oscillate in phase with one another when said supply voltage is applied.

31. The method of claim 30 comprising the additional step of connecting a resistor in each of said conduction paths.

32. The method of claim 31 comprising the additional step of adjusting said phase shifting means so as to vary the frequency of said oscillator.

33. A method of generating an oscillating voltage signal within a continuous range of frequencies, said method comprising the steps of:
providing a multiple section crystal bandpass filter, said bandpass filter comprising a plurality of crystals, each of said crystals having a resonant frequency, said resonant frequencies differing from one another by one or more selected intervals and each of said resonant frequencies lying within said continuous range of frequencies;
connecting said multiple section crystal bandpass filter in a series loop with a phase shifting means; and
applying a supply voltage to said loop.

34. The method of claim 33 comprising the additional step of connecting a pair of inverters in said loop.

35. The method of claim 33 wherein said phase shifting means comprises a plurality of phase shifting circuits.

36. A method of generating an oscillating voltage signal within a continuous range of frequencies, said method comprising the steps of:
providing a multiple section ceramic bandpass filter, said bandpass filter comprising a plurality of ceramic resonators, each of said ceramic resonators having a resonant frequency, said resonant frequencies differing from one another by one or more selected intervals and each of said resonant frequencies lying within said continuous range of frequencies;
connecting said multiple section ceramic bandpass filter in a series loop with a phase shifting means; and
applying a supply voltage to said loop.

37. The method of claim 36 comprising the additional step of connecting a pair of inverters in said series loop.

38. The method of claim 37 wherein said phase shifting means comprises a plurality of phase shifting circuits.

39. A method of perpetuating an oscillating signal, said oscillating signal being at a frequency within a continuous range of frequencies, said method comprising the steps of:
providing a plurality of parallel conduction paths, each of said conduction paths comprising a crystal, a resistor an a capacitor, each of said conduction paths having a resonant frequency, said resonant frequencies differing form one another by one or more selected intervals and each of said resonant frequencies lying within said continuous range of frequencies;
connecting one end of each of said conduction paths to an input terminal of a summing amplifier; and
supplying said oscillating signal to the other end of each of said conduction paths.

40. The method of claim 39 wherein said conduction paths have resonant frequencies at selected intervals within a selected range of frequencies.

41. The method of claim 40 wherein said oscillating signal is a color burst.

42. A wide frequency deviation oscillator for providing an output signal within a continuous range of frequencies, said oscillator comprising:
an amplifier;
a phase shifting means; and a multiple-section crystal or ceramic bandpass filter, said multiple-section bandpass filter containing a plurality of crystal or ceramic resonators;

said amplifier, said phase shifting means, and said bandpass filter being connected in series in a loop.

43. A wide frequency deviation oscillator comprising:
an amplifier;
a phase shifting means; and
a multiple section crystal or ceramic bandpass filter, said multiple section bandpass filter containing N crystal or ceramic elements and N parallel conduction paths, one of said crystal or ceramic elements being connected in each of said parallel conduction paths, each of said conduction paths having a resonant frequency, said resonant frequencies differing from one another by one or more selected intervals within a range of frequencies;
wherein said amplifier, said phase shifting means and said bandpass filter are connected in series in a loop and wherein each of said crystal or ceramic elements has substantially the same resonant frequency and at least N−1 of said conduction paths contain a capacitive means connected to the crystal or ceramic element in said conduction path to form a combination with said crystal or ceramic element.

44. The oscillator of claim 43 wherein each of said combinations has a resonant frequency which differs from respective resonant frequencies of the others of said combinations.

45. The oscillator of claim 44 wherein each of said capacitive means comprises a varactor diode.

46. A wide frequency deviation oscillator comprising:
an amplifier;
a phase shifting means; and
a multiple section crystal or ceramic bandpass filter, said multiple section bandpass filter containing a plurality of crystal or ceramic elements and a plurality of parallel conduction paths, one of said crystal or ceramic elements being connected in each of said parallel conduction paths, each of said conduction paths having a resonant frequency, said resonant frequencies differing from one another by one or more selected intervals within a range of frequencies;
wherein said amplifier, said phase shifting means and said bandpass filter are connected in series in a loop and wherein each of said parallel conduction paths includes a driving transistor for driving the crystal or ceramic element in said conduction path.

47. A wide frequency deviation oscillator comprising:
an amplifier;
a phase shifting means; and
a multiple section crystal or ceramic bandpass filter, said multiple section bandpass filter containing a plurality of crystal or ceramic elements and a plurality of parallel conduction paths, one of said crystal or ceramic elements being connected in each of said parallel conduction paths, each of said conduction paths having a resonant frequency, said resonant frequencies differing from one another by one or more selected intervals within a range of frequencies;
wherein said amplifier, said phase shifting means and said bandpass filter are connected in series in a loop and wherein each of said parallel conduction paths includes a summing transistor.

48. The oscillator of claim 46 wherein each of said parallel conduction paths includes a summing transistor.

49. A wide frequency deviation oscillator comprising:
an amplifier;
a phase shifting means; and
a multiple section crystal or ceramic bandpass filter, said multiple section bandpass filter containing a plurality of crystal or ceramic elements and a plurality of parallel conduction paths, one of said crystal or ceramic elements being connected in each of said parallel conduction paths, each of said conduction paths having a resonant frequency, said resonant frequencies differing from one another by one or more selected intervals within a range of frequencies;
wherein said amplifier, said phase shifting means and said bandpass filter are connected in series in a loop and wherein said conduction paths share a common driving transistor for driving said crystals and a common summing transistor.

50. A wide frequency deviation oscillator comprising:
an amplifier;
a phase shifting means; and
a multiple section crystal or ceramic bandpass filter, said multiple section bandpass filter containing a plurality of crystal or ceramic elements;
wherein said amplifier, said phase shifting means and said bandpass filter are connected in series in a loop; and
wherein said phase shifting means comprises an inductance for providing a lag current to a first transistor, a capacitance for providing a lead current to a second transistor, means for adjusting the current flow through at least one of said first and second transistors, and means for summing respective outputs from said first and second transistors.

51. The oscillator of claim 45 wherein said phase shifting means comprises an inductance for providing a lag current to a first transistor, a capacitance for providing a lead current to a second transistor, means for adjusting the current flow through at least one of said first and second transistors, and means for summing respective outputs from said first and second transistors.

52. A color burst ringing circuit for a television receiver comprising a plurality of crystals and a plurality of parallel conduction paths, one of said crystals being connected into each of said conduction paths, one end of each of said conduction paths being connected to an input of a summing amplifier, and the other end of each of said conduction paths being connected to an output of a voltage amplifier, a gating means being connected to an input of said voltage amplifier.

53. An oscillator comprising a resonant circuit, said resonant circuit comprising:
a plurality of crystals and a plurality of parallel conduction paths, one of said crystals being connected into each of said conduction paths;
a summing amplifier, one end of each of said conduction paths being connected to an input of said summing amplifier;
a voltage amplifier, the other end of each of said conduction paths being connected to an output of said voltage amplifier; and a phase shifting means connected between an output of said summing amplifier and an input of said voltage amplifier.

54. The oscillator of claim 53 wherein said phase shifting means comprises a varactor diode connected in series with an inductance and a resistance.

55. The oscillator of claim 53 wherein said phase shifting means comprises an inductance for providing a lag current to a first transistor, a capacitance for providing a lead current to a second transistor, means for adjusting the current flow through at least one of said first and second transistors, and means for summing respective outputs from said first and second transistors.

56. The oscillator of claim 53 comprising a plurality of variable capacitors, one of said variable capacitors being connected to each of said conduction paths.

57. A method of perpetuating a color burst comprising the steps of:
providing a plurality of parallel conduction paths, each of said conduction paths comprising a crystal, a resistor and a capacitor, the respective conduction paths having resonant frequencies at selected intervals within a selected range of frequencies;
connecting one end of each of said conduction paths to an input terminal of a summing amplifier; and
supplying said color burst to the other end of each of said conduction paths.

* * * * *